United States Patent
Ahmed et al.

(10) Patent No.: US 6,987,670 B2
(45) Date of Patent: Jan. 17, 2006

(54) DUAL POWER MODULE POWER SYSTEM ARCHITECTURE

(75) Inventors: Sayeed Ahmed, Canton, MI (US); Fred Flett, Bloomfield, MI (US); Ajay V. Patwardhan, Canton, MI (US); Douglas K. Maly, Canton, MI (US)

(73) Assignee: Ballard Power Systems Corporation, Dearborn, MI (US)

( * ) Notice: Subject to any disclaimer, the term of this patent is extended or adjusted under 35 U.S.C. 154(b) by 129 days.

(21) Appl. No.: 10/642,424

(22) Filed: Aug. 14, 2003

(65) Prior Publication Data

US 2004/0228094 A1 Nov. 18, 2004

Related U.S. Application Data

(60) Provisional application No. 60/471,387, filed on May 16, 2003.

(51) Int. Cl.
*H05K 7/20* (2006.01)

(52) U.S. Cl. .............. 361/699; 257/714; 165/80.4; 361/704; 361/710; 361/715; 363/141; 363/144

(58) Field of Classification Search ............ 174/15.1; 165/80.4; 361/707–710, 688–689, 698–702, 361/711, 715; 363/141–147; 257/714
See application file for complete search history.

(56) References Cited

U.S. PATENT DOCUMENTS

| | | | |
|---|---|---|---|
| 4,142,231 A | 2/1979 | Wilson et al. | 363/141 |
| 4,224,663 A | 9/1980 | Maiese et al. | 363/144 |
| 4,458,305 A | 7/1984 | Buckle et al. | 363/141 |
| 4,661,897 A | 4/1987 | Pitel | 363/17 |
| 4,674,024 A | 6/1987 | Paice et al. | 363/71 |

(Continued)

FOREIGN PATENT DOCUMENTS

| | | |
|---|---|---|
| DE | 0 427 143 A2 | 5/1991 |
| DE | 195 19 538 A1 | 11/1996 |
| EP | 0 578 108 A1 | 1/1994 |
| JP | 9-117126 | 5/1997 |

OTHER PUBLICATIONS

Kim, T–J, et al., "The Analysis of Conduction and Switching Losses in Multi–Level Inverter System," *IEEE*, pp. 1363–1368, 2001.

Mohan et al., *Power Electronics: Converters, Applications and Designs*, John Wiley & Sons Inc., USA, 1989, Chapter 26–8, "Circuit Layout," p. 654.

Persson, E., "Power Electronic Design and Layout Techniques for Improved Performance and Reduced EMI," in *Proceedings of Power Electronics in Transportation, IEEE*, Dearborn, Michigan, Oct. 20–21, 1994, pp. 79–82.

Ratnayake, K. et al., "Novel Carrier PWM Scheme to Control Neutral Point Voltage Fluctuations in Three–Level Voltage Source Inverter," *IEEE Intl. Conf. on Power Electronics and Drive Systems*, PEDS '99, Jul. 1999, Hong Kong, pp. 663–667.

U.S. Appl. No. 60/233,992, Ahmed et al., filed Sep. 20, 2000.

U.S. Appl. No. 60/233,993, Ahmed et al., filed Sep. 20, 2000.

U.S. Appl. No. 60/233,994, Ahmed et al., filed Sep. 20, 2000.

U.S. Appl. No. 60/233,995, Ahmed et al., filed Sep. 20, 2000.

(Continued)

*Primary Examiner*—Gregory Thompson
(74) *Attorney, Agent, or Firm*—Seed IP Law Group PLLC

(57) ABSTRACT

A dual power module architecture employing a high degree of modularity, that allows a base power module to be quickly, easily, and cost effectively configured to address a large variety of applications.

33 Claims, 14 Drawing Sheets

U.S. PATENT DOCUMENTS

| | | | | |
|---|---|---|---|---|
| 4,884,168 A | * | 11/1989 | August et al. | 361/702 |
| 5,172,310 A | | 12/1992 | Deam et al. | 363/144 |
| 5,184,291 A | | 2/1993 | Crowe et al. | 363/37 |
| 5,230,632 A | | 7/1993 | Baumberger et al. | 439/66 |
| 5,243,757 A | | 9/1993 | Grabbe et al. | 29/882 |
| 5,264,761 A | | 11/1993 | Johnson et al. | 315/291 |
| 5,395,252 A | | 3/1995 | White | 439/66 |
| 5,422,440 A | | 6/1995 | Palma | 174/133 B |
| 5,439,398 A | | 8/1995 | Testa et al. | 439/801 |
| 5,445,526 A | | 8/1995 | Hoshino et al. | 439/69 |
| 5,459,356 A | | 10/1995 | Schulze et al. | 257/773 |
| 5,508,560 A | | 4/1996 | Koehler et al. | 257/730 |
| 5,537,074 A | | 7/1996 | Iversen et al. | 327/564 |
| 5,559,374 A | | 9/1996 | Ohta et al. | 257/723 |
| 5,635,751 A | | 6/1997 | Ikeda et al. | 257/584 |
| 5,653,598 A | | 8/1997 | Grabbe | 439/66 |
| 5,756,935 A | | 5/1998 | Balanovsky et al. | 174/52.1 |
| 5,804,761 A | * | 9/1998 | Donegan et al. | 174/15.1 |
| 5,847,951 A | | 12/1998 | Brown et al. | 363/147 |
| 5,938,451 A | | 8/1999 | Rathburn | 439/66 |
| 5,966,291 A | * | 10/1999 | Baumel et al. | 361/707 |
| 5,975,914 A | | 11/1999 | Uchida | 439/66 |
| 6,054,765 A | | 4/2000 | Eytcheson | 257/724 |
| 6,072,707 A | | 6/2000 | Hochgraf | 363/71 |
| 6,078,173 A | | 6/2000 | Kumar et al. | 324/158.1 |
| 6,078,501 A | | 6/2000 | Catrambone et al. | 361/704 |
| 6,166,937 A | | 12/2000 | Yamamura et al. | 363/141 |
| 6,176,707 B1 | | 1/2001 | Neidich et al. | 439/66 |
| 6,212,087 B1 | | 4/2001 | Grant et al. | 363/144 |
| 6,292,371 B1 | | 9/2001 | Toner, Jr. | 361/752 |
| 6,434,008 B1 | | 8/2002 | Yamada et al. | 361/728 |
| 6,603,672 B1 | | 8/2003 | Deng et al. | 363/37 |
| 6,661,659 B2 | * | 12/2003 | Tamba et al. | 361/699 |
| 6,798,677 B2 | * | 9/2004 | Jakob et al. | 363/123 |
| 6,885,553 B2 | * | 4/2005 | Pfeifer et al. | 361/688 |
| 2002/0034088 A1 | | 3/2002 | Parkhill et al. | 363/144 |
| 2002/0111050 A1 | | 8/2002 | Parkhill et al. | 439/65 |
| 2002/0118560 A1 | | 8/2002 | Ahmed et al. | 363/144 |
| 2002/0126465 A1 | | 9/2002 | Maly et al. | 361/818 |
| 2002/0167828 A1 | | 11/2002 | Parkhill et al. | 363/144 |

OTHER PUBLICATIONS

U.S. Appl. No. 60/233,996, Ahmed et al., filed Sep. 20, 2000.

U.S. Appl. No. 60/471,387, Ahmed et al., filed May 16, 2003.

Seo, J. et al., "A New Simplified Space–Vector PWM Method for Three–Level Inverters," *IEEE Transactions on Power Electronics* 16(4):545–550, Jul. 2001.

* cited by examiner

DUAL POWER MODULE POWER SYSTEM ARCHITECTURE

BACKGROUND OF THE INVENTION

1. Field of the Invention

This disclosure is generally related to electrical power systems, and more particularly to power module architectures suitable for rectifying, inverting and/or converting electrical power between power sources and loads.

2. Description of the Related Art

Power modules are typically self-contained units that transform and/or condition power from one or more power sources for supplying power to one or more loads. Power modules commonly referred to as "inverters" transform direct current (DC) to alternating current (AC), for use in supplying power to an AC load. Power modules commonly referred to as a "rectifiers" transform AC to DC. Power modules commonly referred to as "DC/DC converters" step up or step down a DC voltage. An appropriately configured and operated power module may perform any one or more of these functions. The term "converter" is commonly applied generically to all power modules whether inverters, rectifiers and/or DC/DC converters.

There are a large variety of applications requiring power transformation and/or conditioning. For example, a DC power source such as a fuel cell system, battery and/or ultracapacitor may produce DC power, which must be inverted to supply power to an AC load such as a three-phase AC motor in an electric or hybrid vehicle. A photo-voltaic array may produce DC power which must be inverted to supply or export AC power to a power grid of a utility. An AC power source such as a power grid or micro-turbine may need to be rectified to supply power to a DC load such as a tool, machine or appliance. A high voltage DC source may need to be stepped down to supply a low voltage load, or a low voltage DC source may need to be stepped up to supply a high voltage load. Other applications will become apparent to those of skill in the art based on the teachings herein.

Addressing these various applications typically requires the custom design of a suitable power module. Custom designing of power modules results in excessive costs related to the design process, as well as, duplicative costs related to the creation of custom tooling, the manufacture of custom parts, and maintenance of separate inventories. Custom designing also reduces time to market. It would be desirable to have a power module that allows the investment in design, tooling, manufacturing and inventorying to be shared across many application specific products, and may shorten time to market.

SUMMARY OF THE INVENTION

The disclosure is directed to an architecture for a power module, employing a high degree of modularity, that allows a base power module to be quickly, easily, and cost effectively configured to address a large variety of applications by simply interchanging components, electrical connections, and/or software.

In one aspect, a power system comprises: a first power module comprising a module housing, a cold plate attached to the module housing, a first bus accessible from an exterior of the module housing, a second bus accessible from the exterior of the module housing, the second bus electrically isolated from the first bus, a first set of electrical terminals accessible from the exterior of the module housing, for each of the electrical terminals in the first set of electrical terminals, a number of first leg components electrically coupled between the electrical terminal and the first bus, and a number of second leg components electrically coupled between the electrical terminal and the second bus; a second power module comprising a module housing, a cold plate attached to the module housing, a first bus accessible from an exterior of the module housing, a second bus accessible from the exterior of the module housing, the second bus electrically isolated from the first bus, a first set of electrical terminals accessible from the exterior of the module housing, for each of the electrical terminals in the first set of electrical terminals, a number of first leg components electrically coupled between the electrical terminal and the first bus, and a number of second leg components electrically coupled between the electrical terminal and the second bus; and at least one external connector electrically coupling the first and the second buses of the first power module with respective ones of the first and the second buses of the second power module.

In another aspect, a power system comprises: a rectifier power module comprising a module housing, a cold plate attached to the module housing, a set of input terminals, a first output bus and a second output bus; an inverter power module comprising a module housing, a cold plate attached to the module housing, a first input bus, a second input bus, and a set of output terminals, wherein the cold pate of the inverter power module faces the cold plate of the rectifier power module; and at least one external connector electrically coupling each of the first and the second output buses of the rectifier with a respective one of the first and the second input buses of the inverter power module.

In yet another aspect, a power system comprises: a first rectifier power module comprising a module housing, a cold plate attached to the module housing, a set of input terminals, a first output bus and a second output bus; a second rectifier power module comprising a module housing, a cold plate attached to the module housing, a set of input terminals, a first output bus and a second output bus, wherein the cold pate of the second rectifier power module faces the cold plate of the first rectifier power module; and at least one external connector electrically coupling each of the first and the second output buses of the first rectifier module with a respective one of the first and the second output buses of the second rectifier power module.

In still another aspect, a power system comprises: a first inverter power module comprising a module housing, a cold plate attached to the module housing, a first input bus and a second input bus, and a set of output terminals; a second inverter power module comprising a module housing, a cold plate attached to the module housing, a first input bus and a second input bus, and a set of output terminals, wherein the cold pate of the second inverter power module faces the cold plate of the first inverter power module; and at least one external connector electrically coupling each of the first and the second input buses of the first inverter input module with a respective one of the first and the second input buses of the second inverter power module.

In a further aspect, a method of forming a power system comprises: providing a first power module comprising a module housing, a cold plate attached to the module housing, a first bus accessible from an exterior of the module housing, a second bus accessible from the exterior of the module housing, the second bus electrically isolated from the first bus, a first set of electrical terminals accessible from the exterior of the module housing, for each of the electrical terminals in the first set of electrical terminals, a number of first leg components electrically coupled between the electrical terminal and the first bus, and a number of second leg components electrically coupled between the electrical terminal and the second bus; providing a second power module comprising a module housing, a cold plate attached to the module housing, a first bus accessible from an exterior of the module housing, a second bus accessible from the exterior of the module housing, the second bus electrically isolated from the first bus, a first set of electrical terminals accessible from the exterior of the module housing, for each of the electrical terminals in the first set of electrical terminals, a number of first leg components electrically coupled between the electrical terminal and the first bus, and a number of second leg components electrically coupled between the electrical terminal and the second bus; and externally electrically coupling the first and the second buses of the first power module with respective ones of the first and the second buses of the second power module.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various embodiments of the invention. However, one skilled in the art will understand that the invention may be practiced without these details. In other instances, well-known structures associated with power modules, power semiconductor devices and controllers have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including, but not limited to."

The headings provided herein are for convenience only and do not interpret the scope or meaning of the claimed invention.

Base Power Module

Figure 1:
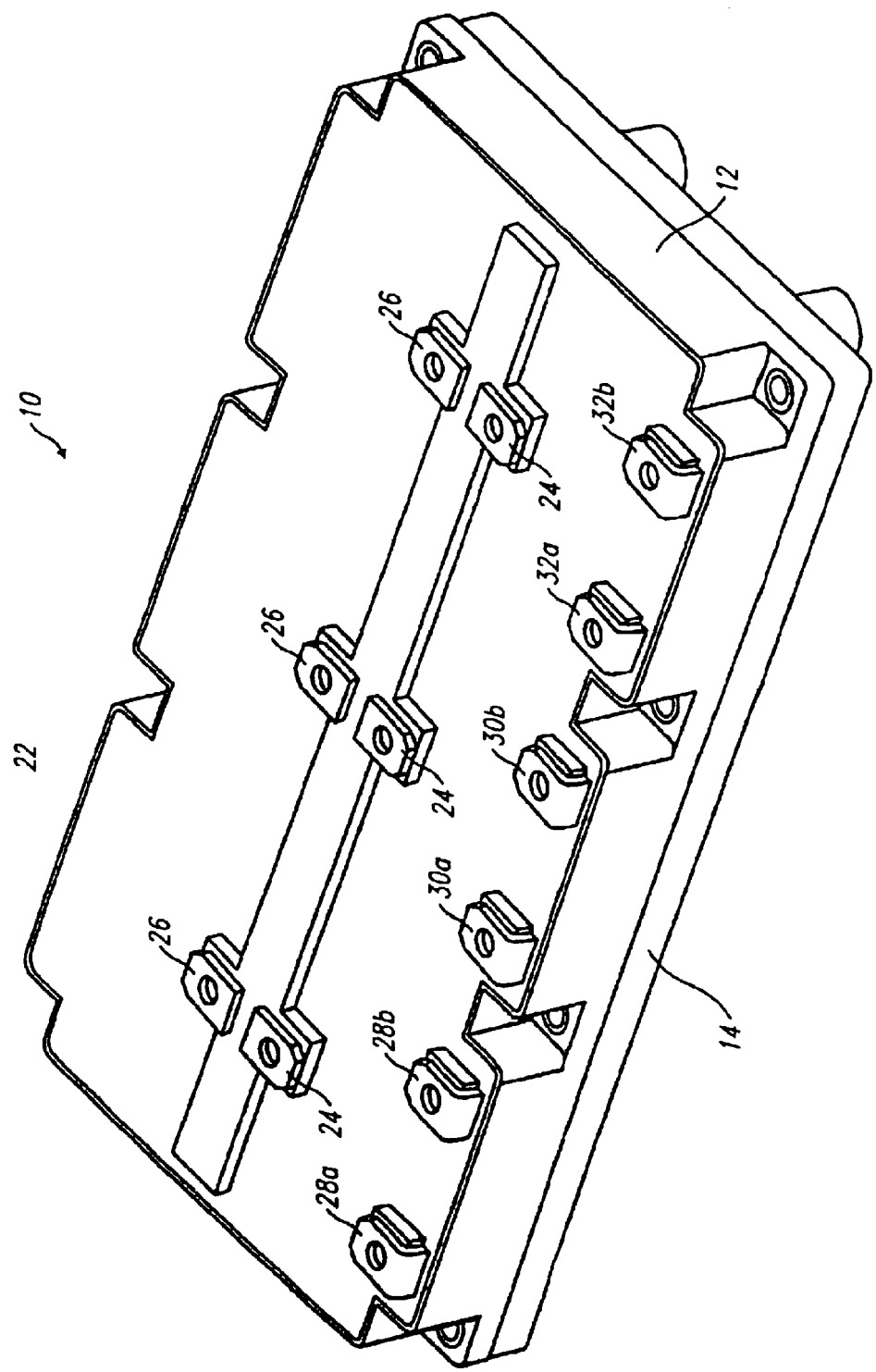
FIG. 1 is an isometric view of a power module comprising a housing, integrated cold plate, DC bus terminals, AC phase terminals, and power semiconductor devices.
Figure 2A:
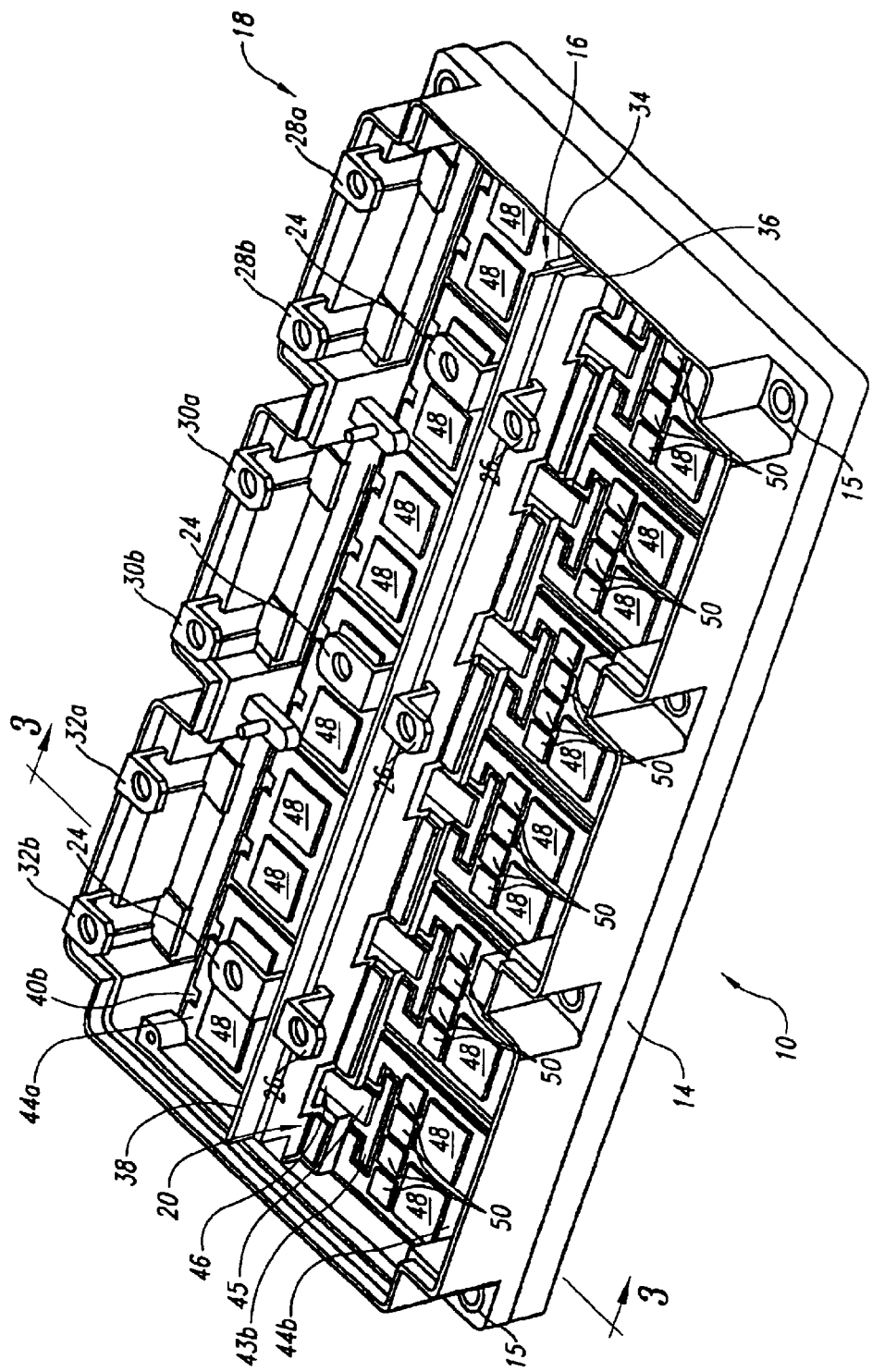
FIG. 2A is an isometric view of the power module of FIG. 1 with a cover removed and some portions broken or removed to show the DC bus, the AC bus, and the power semiconductor devices carried by a number of regions carried by a substrate.
Figure 2B:
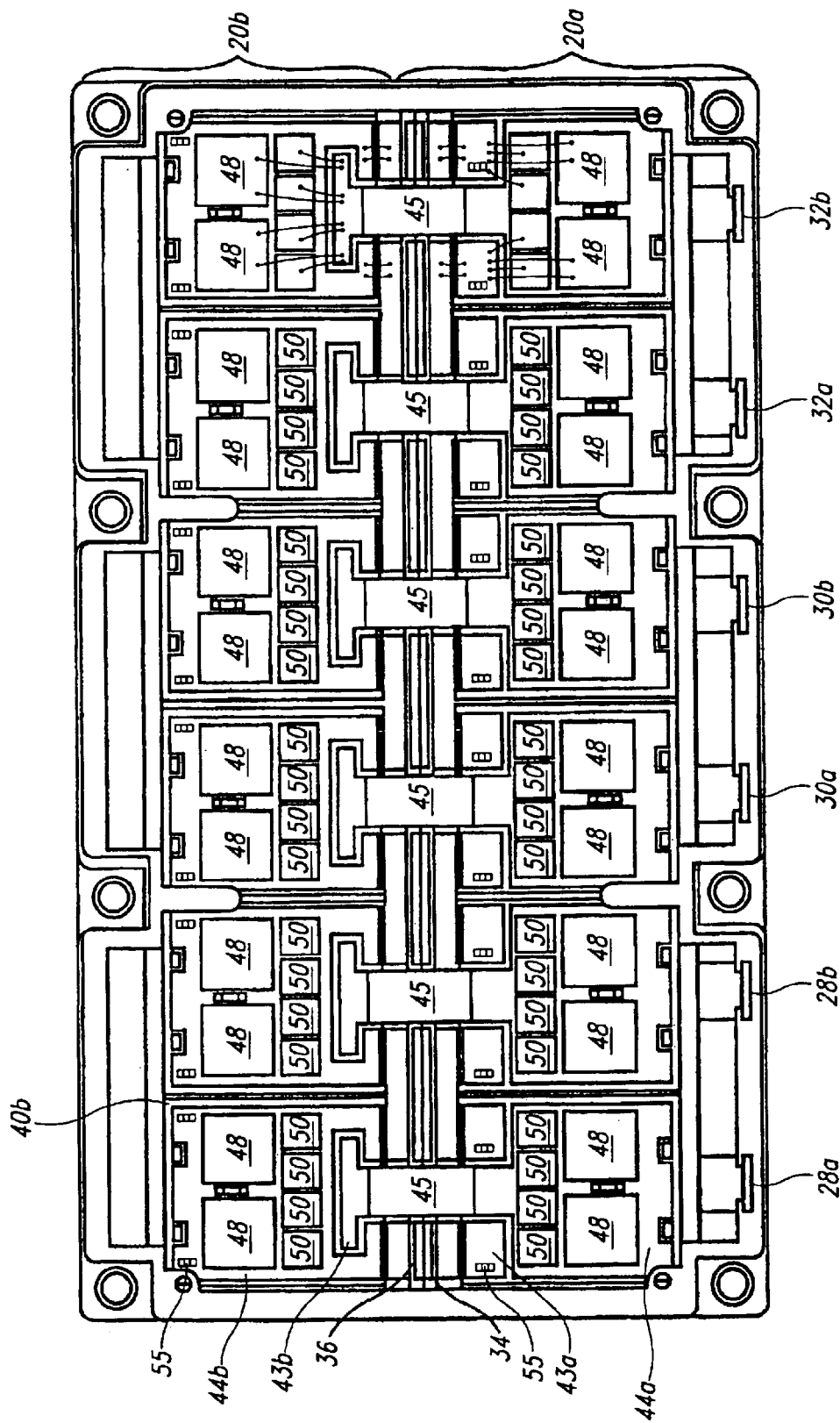
FIG. 2B is a top plan view of the power module of FIG. 2A showing a representative sampling of wire bonds electrically connecting various power semiconductor devices, buses, and layers in the substrate as an inverter.

FIGS. 1, 2A, and 2B show a base power module 10, generally comprising: a lead frame or housing 12, an integrated cold plate 14 attached to the housing 12 via bushings 15, a DC bus 16, an AC bus 18; and power semiconductor devices 20 electrically coupled between the DC bus 16 and AC bus 18, forming a high side 20b and a low side 20a of the power module 10. The base power module 10 may further include one or more gate drivers 22 (FIG. 9) for driving some of the power semiconductor devices 20.

Two sets of DC bus terminals 24, 26 extend out of the housing 12. As discussed in detail below, in some applications one set of DC bus terminals 26 is electrically coupled to a positive voltage or high side of a power source or load and the other set of DC bus terminals 24 is electrically coupled to a negative voltage or low side of the power source or load. In other applications, the DC bus terminals 24, 26 are electrically coupled to respective DC bus terminals 24, 26 on another power module. A set of AC phase terminals comprises three pairs of AC bus phase terminals 28a, 28b, 30a, 30b, 32a, 32b, extending out of the housing 12. As discussed in detail below, in some applications, one pair of AC phase terminals is coupled to a respective phase (A, B, C) of a three phase power source or load. In other applications, some of the AC phase terminals are interconnected across or between the pairs, and coupled to power sources or loads.

Figure 3:
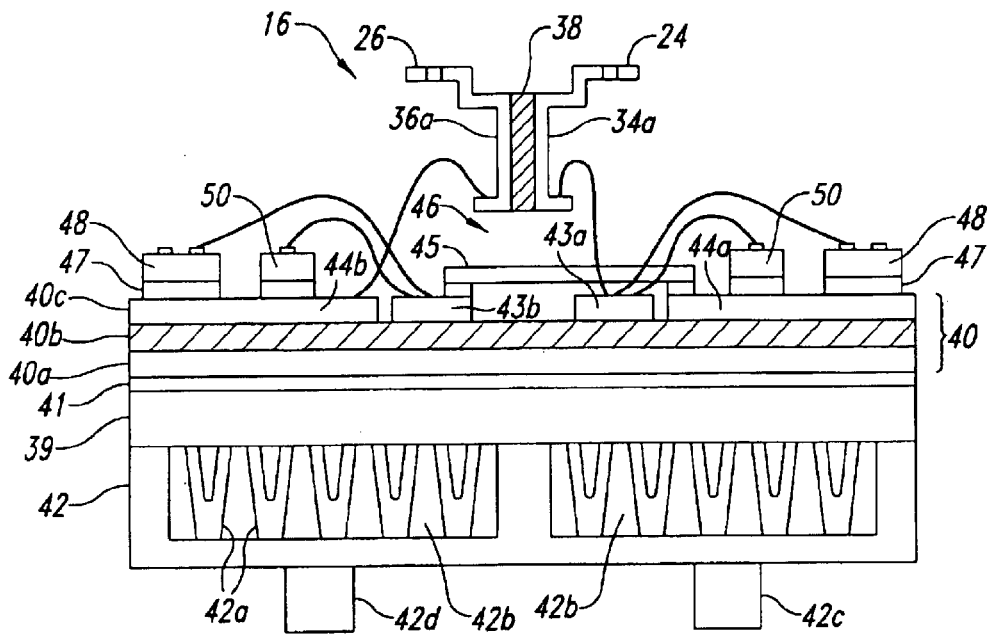
FIG. 3 is a schematic cross sectional view of one embodiment of the DC bus comprising a pair of L-shaped DC bus bars spaced by an electrical insulation.

FIG. 3 shows a schematic cross-sectional view of the power module 10 taken along section line 3—3 of FIG. 2A. FIG. 3 is not an exact cross-sectional view, but has been modified to more accurately represent the electrical connections which would otherwise not be clearly represented in the FIG. 3.

The integrated cold plate 14 comprises a metal base plate 39, a direct copper bonded (DCB) substrate 40 which is attached to the metal base plate 39 by a solder layer 41. A cooling header 42 includes a number of cooling structures such as fins 42a, one or more fluid channels 42b, and a fluid inlet 42c and a fluid outlet 42d for providing fluid connection flow to and from the fluid channels 42b, respectively.

The DCB substrate 40 typically comprises a first copper layer 40a, a ceramic layer 40b and a second copper layer 40c which are fused together. The second copper layer 40c may be etched or otherwise processed to form electrically isolated patterns or structures, as is commonly known in the art. For example, the second copper layer 40c may be etched to form regions of emitter plating 43a and collector plating 44a on a low side of the power module 10 (i.e., side connected to DC bus bar 34). Also for example, the second copper layer 40c may be etched to form regions of emitter plating 43b and collector plating 44b on the high side of the power module 10 (i.e., the side connected to DC bus bar 36).

A conductive strip 45 or wire bonds may extend between the collector plating 44a of the low side and the emitter plating 43b of the high side, passing through respective passages 46 formed under the DC bus bars 34, 36. As illustrated, the conductive strip 45 has be exaggerated in length on the low side of the power module 10 to better illustrate the electrical connection with the collector plating 44a.

The power semiconductor devices 20 are attached to the various structures formed in the second copper layer 40c via a solder 47. The power semiconductor devices 20 may include one or more switches for example, transistors 48 such as integrated bipolar gate transistors (IGBTs) or metal oxide semiconductor field effect transistors (MOSFETS). The power semiconductor devices 20 may also include one or more diodes 50. The power semiconductor devices 20 may have one or more terminals directly electrically coupled by the solder 47 to the structure on which the specific circuit element is attached. For example, the collectors of IGBTs 48 may be electrically coupled directly to the collector plating 44a, 44b by solder 47. Similarly, the cathodes of diodes 50 may be electrically coupled directly to the collector plating 44a, 44b by solder 47.

The DC bus 16 comprises a pair of L-shaped or vertical DC bus bars 34a, 36a. The upper legs of the L-shaped DC bus bars 34a, 36a are parallel and spaced from one another by the bus bar insulation 38. The lower legs of the L-shaped DC bus bars 34a, 36a are parallel with respect to the substrate 40 to permit wire bonding to appropriate portions of the substrate. For example, the negative DC bus bar 34a may be wire bonded to the emitter plating 43a of the low side, while the positive DC bus bar 36a may be wire bonded to the collector plating 44b of the high side. The emitters of the IGBTs 48 and anodes of the diodes 50 may be wire bonded to the respective emitter plating 43a, 43b. Wire bonding in combination with the rigid structure of the DC bus 16 and housing 12 may also eliminate the need for a hard potting compound typically used to provide rigidity to protect solder interfaces. For low cost, the copper layers 40a and 40c may be nickel finished or aluminum clad, although gold or palladium may be employed at the risk of incurring higher manufacturing costs.

Figure 4:
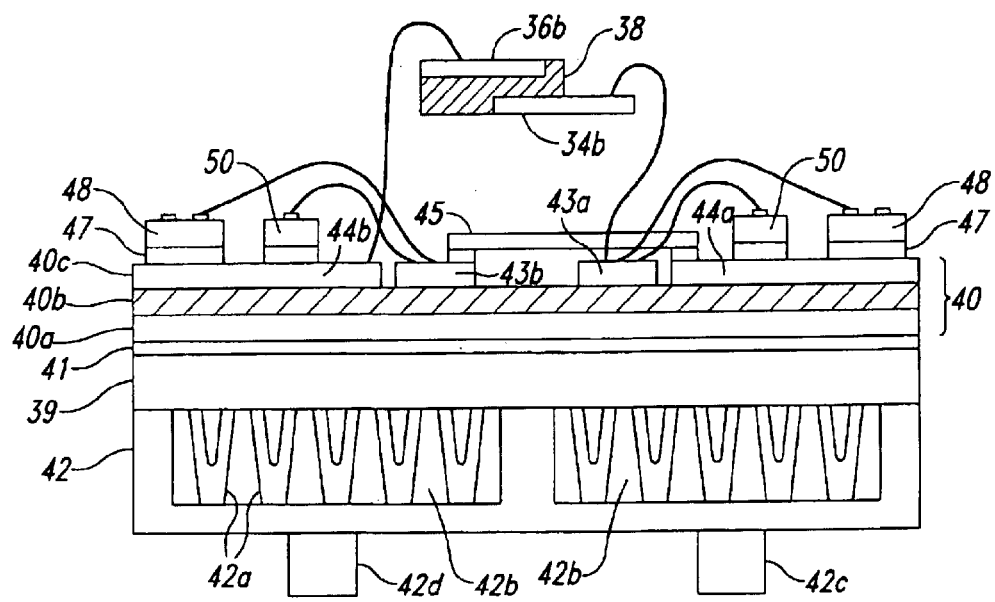
FIG. 4 is a schematic cross sectional view of one embodiment of the DC bus comprising a pair of generally planar DC bus bars spaced by an electrical insulation.

FIG. 4 shows another embodiment of the DC bus 16 for use in the power module 10, the DC bus 16 comprising a pair of generally planar DC bus bars 34b, 36b parallel and spaced from one another by a bus bar insulation 38. The DC bus bars 34b, 36b are horizontal with respect to a substrate 40 (FIGS. 2A and 2B), with exposed portions to permit wire bonding to the various portions of the substrate 40.

Because the DC bus bars 34, 36 are parallel, counter flow of current is permitted, thereby canceling the magnetic fields and their associated inductances. In addition the parallel DC bus bars 34, 36 and bus bar insulation 38 construct a distributed capacitance. As will be understood by one of ordinary skill in the art, capacitance dampens voltage overshoots that are caused by the switching process. Thus, the DC bus bars 34, 36 of the embodiments of FIGS. 3 and 4 create a magnetic field cancellation as a result of the counter flow of current, and capacitance dampening as a result of also establishing a functional capacitance between them and the bus bar insulation 38.

As best illustrated in FIG. 2B, the power semiconductor devices 20 include a number of decoupling, high frequency capacitors 55 which are electrically coupled between the DC bus bars 34, 36 and ground to reduce EMI. In contrast to prior designs, the capacitors 55 are located on the substrate 40 inside the housing 12. For example, some of the capacitors 55 are electrically coupled directly to the emitter plating 43a on the low side of the substrate 40 and some of the capacitors 55 are electrically coupled directly to the collector plating 44b on the high side of the substrate 40. The capacitors 55 can be soldered in the same operation as the soldering of the substrate 40 to the cold plate 14.

The power semiconductor devices 20 also include a number of snubber capacitors (not shown) electrically coupled between the DC bus bars 34, 36 to clamp voltage overshoot. For example, some of the snubber capacitors are electrically coupled directly to the emitter plating 43a on the low side of the substrate 40 and the collector plating 44b on the high side of the substrate 40. Significant savings may be realized by effective clamping of voltage overshoot. For example, if switching transients are maintained below approximately 900V, a transformer may be eliminated. The snubber capacitors can be soldered in the same operation as the soldering of the substrate 40 to the cold plate 14.

As best illustrated in FIGS. 1 and 2A, the DC bus bars 34, 36 each include three terminals 24, 26, spaced along the longitudinal axis, to make electrical connections, for example, to a DC power source. Without being restricted to theory, Applicants believe that the spacing of the terminals 24, 26 along the DC bus bars 34, 36 provides lower inductance paths within the DC bus bars 34, 36 and to the external DC voltage storage bank.

In contrast to typical power modules, the DC bus bars 34, 36 are internal to the housing 12. This approach results in better utilization of the bus voltage, reducing inductance and consequently permitting higher bus voltages while maintaining the same margin between the bus voltage and the voltage rating of the various devices. The lower inductance reduces voltage overshoot, and problems associated with voltage overshoot such as device breakdown. The increase in bus voltage permits lower currents, hence the use of less costly devices. The bus bar insulation 38 between the DC bus bars 34, 36 may be integrally molded as part of the housing 12, to reduce cost and increase structural rigidity. The DC bus bars 34, 36 may be integrally molded in the housing 12, or alternatively, the DC bus bars 34, 36 and bus bar insulation 38 may be integrally formed as a single unit and attached to the housing 12 after molding, for example, via post assembly.

The power semiconductor devices 20 are directly mounted on the substrate 40 which is directly attached to the cold plate 14 via solder layer 41, the resulting structure serving as a base plate. The use of a cold plate 14 as the base plate, and the direct mounting of the power semiconductor devices 20 thereto, enhances the cooling for the power semiconductor devices 20 over other designs, producing a number of benefits such as prolonging the life of capacitors 55.

The power semiconductor devices 20 are operable to transform and/or condition electrical power. As discussed above, the power semiconductor devices 20 may include switches 48 and/or diodes 50. The power semiconductor devices 20 may also include other electrical and electronic components, for example, capacitors 55 and inductors, either discrete or formed by the physical layout. The power module 10 and power semiconductor devices 20 may be configured and operated as an inverter (DC→AC), rectifier (AC→DC), and/or converter (DC→DC; AC→AC). For example, the power module 10 and/or power semiconductor devices 20 may be configured as full three phase bridges, half bridges, and/or H-bridges, as suits the particular application.

Figure 5:
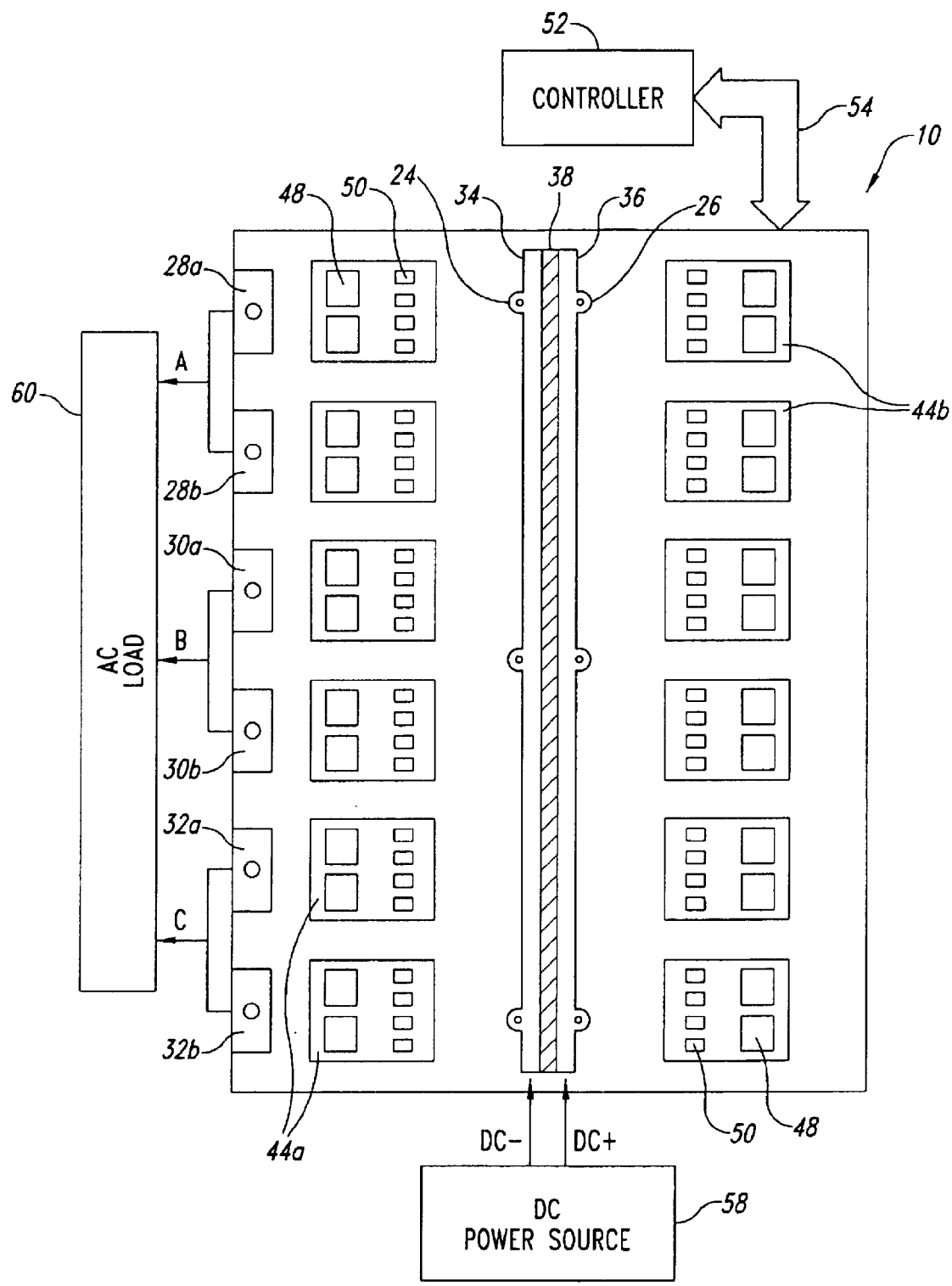
FIG. 5 is a topological view a single power module configured as a power inverter between a power source and a load, illustrating some aspects of the architecture of the power module and the topology of the substrate.

FIG. 5 topographically illustrates the layout of the substrate 40, employing twelve distinct regions of collector plating 44a, 44b, denominated collectively below as regions 44. The regions 44 are generally arranged in a low side row of six areas of collector plating 44a and a high side row of six areas of collector plating 44b. Each region 44 can carry a variety of switches such as IGBTs 48 and/or a variety of diodes 50. The gate drivers 22 (FIG. 9) are coupled to control the power semiconductor devices 20, particularly the switches 48, based on signals received from a controller 52 via a signal bus 54, which may also be integrated into the power module 10 or which may be provided separately therefrom.

A base or standard region 44 typically carries two IGBTs 48 and four diodes 50. However, the inclusion of specific component types (switches such as IGBTs 48 and/or diodes 50) and the number of each component on a region 44 may depend on the specific application. For example, a region 44 may carry up to four IGBTs 48, or alternatively, up to eight diodes 50. Alternatively, a region 44 may carry four diodes 50 and omit IGBTs 48, for example, where the power semiconductor devices 20 on the region 44 will act as a rectifier. The ability to eliminate components where the specific application does not require these components provides significant cost savings. For example, eliminating IGBTs 48 can save many dollars per region 44. The ability to add additional components of one type in the place of components of another type on a region 44 provides some flexibility in adjusting the current and/or voltage rating of the power module 10. Thus, this modular approach reduces costs, and provides flexibility in customizing to meet demands of a large variety of customers. Of course other sizes of regions 44, which may carry more or fewer components, are possible.

In at least one described embodiment, the power module 10 comprises three half bridges combined into a single three-phase switching module, or single half bridge modules that may be linked together to form a three phase inverter. As would be understood by one of ordinary skill in the art, the same DC to AC conversion may be accomplished using any number of half bridges, which correspond to a phase, and each switching pair may contain any number of switching devices. For simplicity and clarity, many of the examples herein use a common three phase/three switching pair configuration, although this should not be considered limiting.

In at least one described embodiment, current flows from the power source through the positive DC bus bar 36 to the collector plating 44b on the high side of the power module 10. Current is then permitted to flow through one or more of the switching devices 48 and/or diodes 50 on the high side to the emitter layer 43b. The current passes to the collector layer 44a on the low side via the conductive strip 45 passing under the DC bus bars 34, 36. A phase terminal allows current to flow from the collector layer 44a on the low side to a load such as a three phase AC motor. Similarly, the negative DC bus bar 34 couples the load to the switching devices 48 and/or diodes 50 on the low side via the emitter layer 43a.

The overall design of the standard power module 10, including the position and structure of the DC and AC buses 16, 18, topology and modularity of substrates 40 and the inclusion of six phase terminals 28a, 28b, 30a, 30b, 32a, 32b in the AC bus 16 provides great flexibility, allowing the standard power module 10 to be customized to a variety of applications with only minor changes and thus relatively small associated costs. A number of these applications are discussed below.

Single Power Module Power Inverter

FIG. 5 also shows a single power module 10 configured as a power inverter. The power inverter may be suitable, for example, for providing 600 A at 1200V. A DC power supply 58 supplies power to the power module 10 via the terminals 24, 26 of the DC power bus 16. The power module 10 supplies three phase AC power to a three phase AC load 60 via the AC bus 18. In particular, the phase terminals 28a, 28b, 30a, 30b, 32a, 32b, are electrically coupled in pairs, each pair supplying a respective phase of the power.

Single Power Module Power Converter

Figure 6:
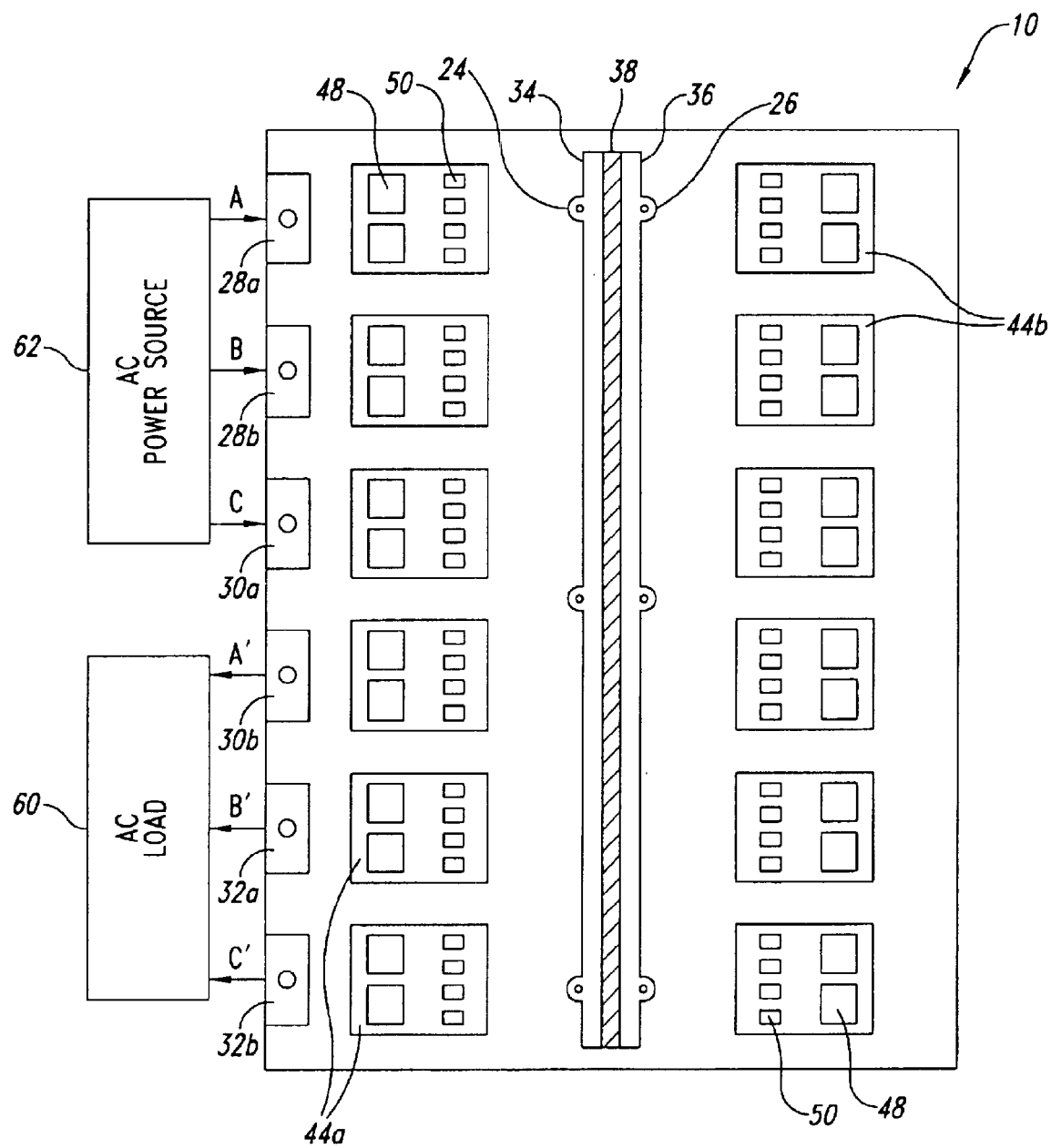
FIG. 6 is a topological view of a single power module configured as an AC/AC power converter between a power source and a load, illustrating some aspects of the architecture of the power module and the topology of the substrate.

FIG. 6 shows a single power module 10 configured as an AC/AC power converter. The power converter may be suitable, for example, for providing 300 A at 1200V. Three of the AC phase terminals 28a, 28b, 30a are electrically coupled to respective phases (A, B, C) of a three phase AC power source 62, while the other three AC phase terminals 30b, 32a, 32b are electrically coupled respective phases of a three phase AC load 60.

Single Power Module Half Bridge Rectifier

Figure 7:
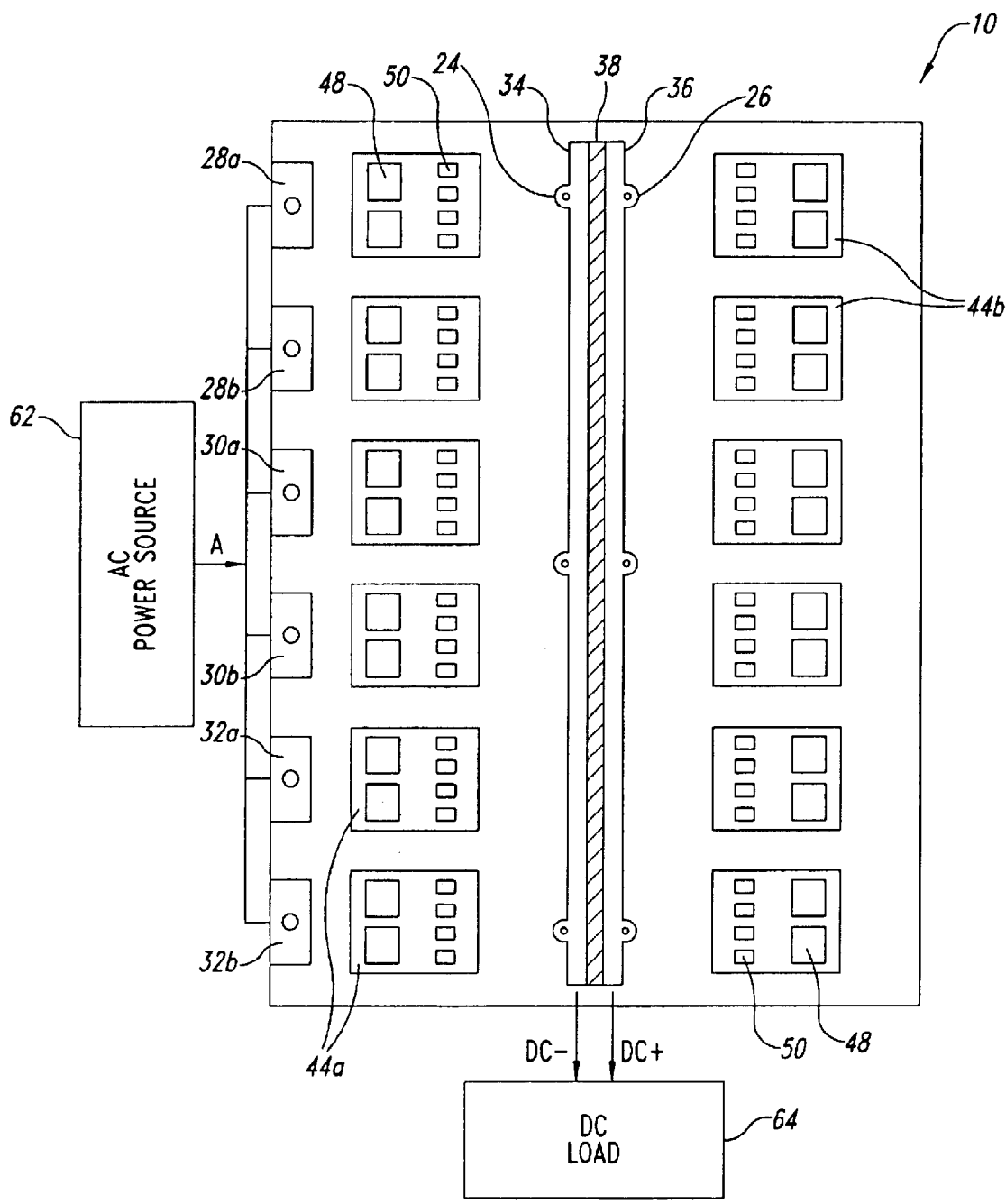
FIG. 7 is a topological view of a single power module configured as a half bridge rectifier between a power source and a load, illustrating some aspects of the architecture of the power module and the topology of the substrate.

FIG. 7 shows a single power module 10 configured as a half bridge rectifier. The half bridge rectifier may be suitable, for example, for providing 1800 A at 1200V or 2400 A at 600V. A typical use would employ a dedicated half bridge for each phase of the power source. All of the AC phase terminals 28a, 28b, 30a, 30b, 32a, 32b of the power module 10 are electrically coupled to one phase (A, B, or C) of the three phase AC power source 62. The DC bus terminals 24, 26 are electrically coupled to respective poles of a DC load 64.

As illustrated, the power module 10 is configured with IGBTs 48 for active rectification. In an alternative embodiment, the power module 10 may employ passive rectification, omitting the IGBTs 48, and thereby reducing parts count and costs.

Single Power Module H-Bridge Rectifier

Figure 8:
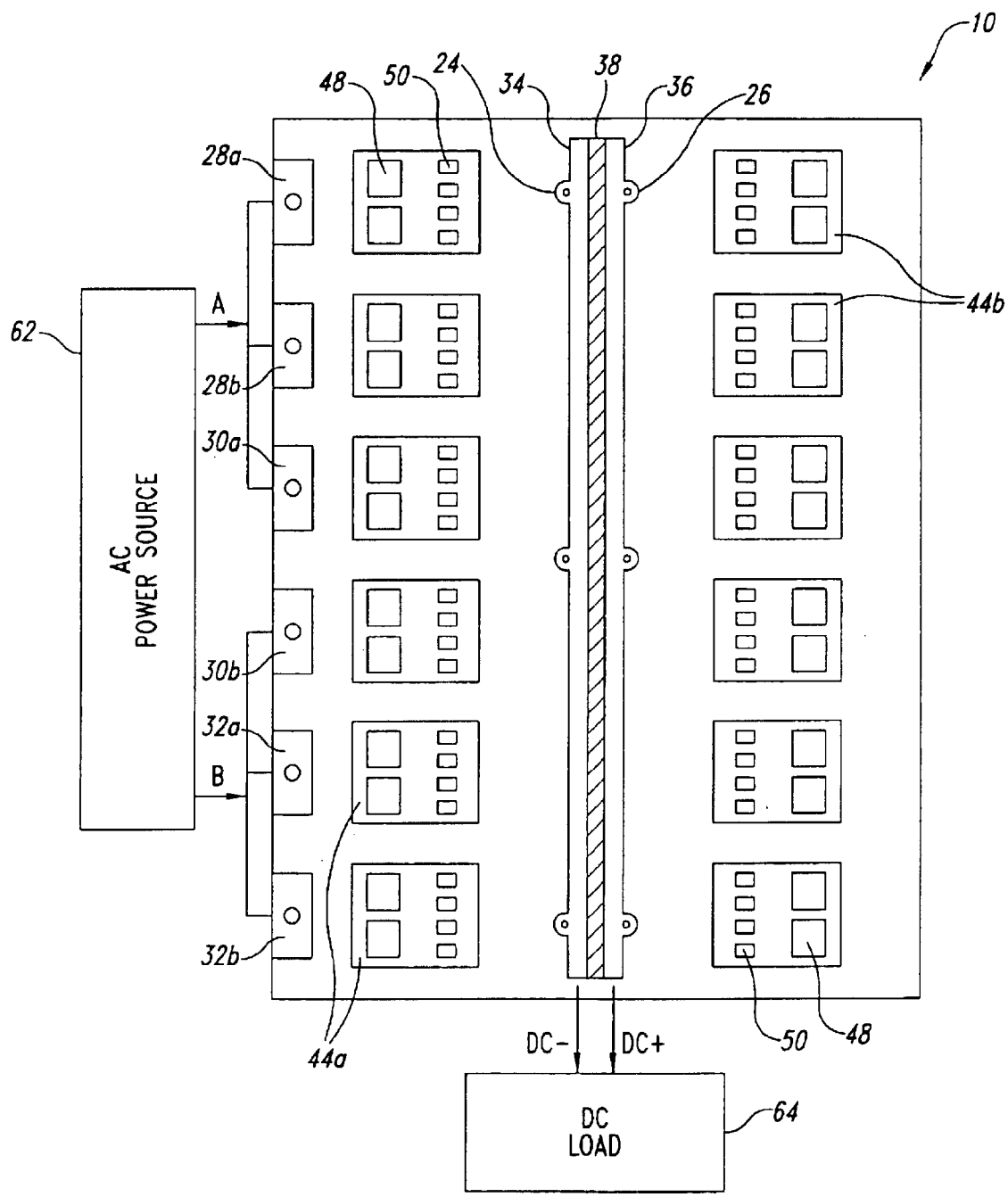
FIG. 8 is a topological view of a single power module configured as an H-bridge rectifier between a power source and a load, illustrating some aspects of the architecture of the power module and the topology of the substrate.

FIG. 8 shows a single power module 10 configured as an H-bridge rectifier. The H-bridge rectifier may be suitable, for example, for providing 900 A at 1200V, sufficient for industrial applications and furnaces such as induction heating. Three of the AC phase terminals 28a, 28b, 30a are electrically coupled to one line of an AC power source 62, while the other AC phase terminals 30b, 32a, 32b are electrically coupled to the other line of the AC power source 62. The DC terminals 24, 26 are electrically coupled to respective poles of a DC load 64.

As illustrated, the power module 10 is configured with IGBTs 48 for active rectification. In an alternative embodiment, the power module 10 may employ passive rectification, omitting the IGBTs 48, and thereby reducing parts count and costs.

Dual Power Module Configurations

Figure 9:
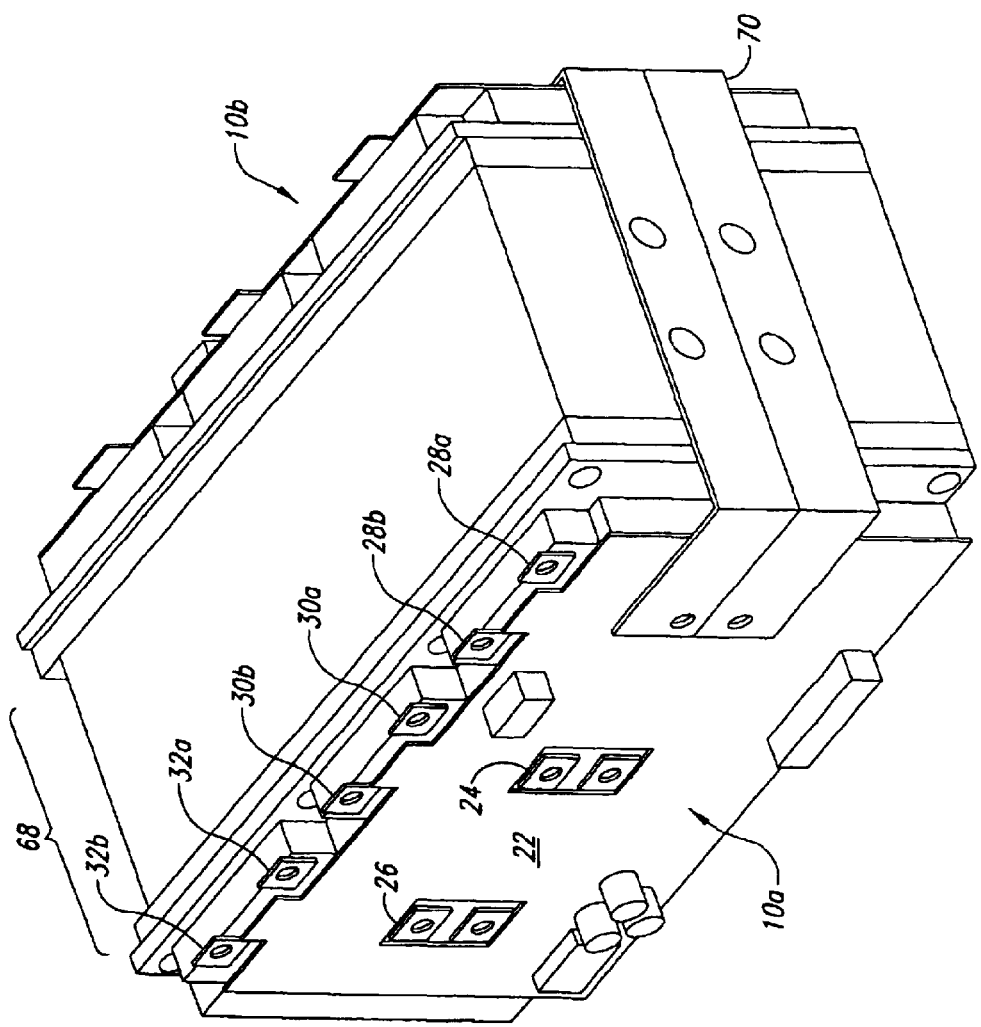
FIG. 9 is an isometric view of a pair of power modules in back-to-back configuration and an external connector electrically coupling the DC buses of the power modules.

FIG. 9 shows a pair of power modules 10a, 10b physically coupled back-to-back with the cold plates 14 facing each other. Alternatively, the power modules 10a, 10b may be physically coupled front-to-front, depending on orientation and specific topology.

A capacitor 68 may positioned between the opposed faces (i.e., backs or fronts) of the first and second power modules 10a, 10b to form a capacitor 68. This takes advantage of the integrated cold plates 14 in the power modules 10a, 10b. Since the capacitor 68 is adjacent the cold plates 14 cooling of the capacitor will be enhanced. Thus, the high power inverter may employ a smaller capacitor than would otherwise be necessary. This may allow the use of a film capacitor (i.e., one or more layers) rather than the typical electrolytic capacitor, further enhancing and contributing to the form function of the power module 10. Film capacitors are available commercially from a variety of sources, including EPCOS AG of Munich, Germany.

An external connector 70 electrically couples the DC bus bars 34, 36 of the first power module 10a to respective ones of the of the DC bus bars 34, 36 of the second module 10b. In some embodiments, the external connector 70 may also function as a clamp, for biasing or holding the first and second power modules 10a, 10b together. The external connector 70 may conform to the exterior of a portion of the power modules 10a, 10b, contributing to the small footprint of the device. For example, the external connector 70 may be approximately U-shaped, as illustrated, including a pair of arms that are sufficiently spaced apart to receive the power modules 10a, 10b therebetween.

The external connector 70 may be a laminate structure formed from at least two conductive layers and a number of insulating layers, at least one of the insulating layers spacing and electrically insulating the two conductive layers. Portions of the insulating layers are removed to expose portions of the conductive layers to allow the electrically connections to the respective DC bus bars 34, 36. Insulating layers may be formed from a variety of commercially available materials, for example, NOMEX® available from E.I. du Pont de Nemours and Company, Advanced Fibers Systems, Richmond, Va.

This modular approach takes advantage of the unique topology of the standard power module 10 to provide a simple, cost effective, form factor solution to meet a large variety of customer demands, as discussed in detail below.

Starter/Main Inverter Combination

Figure 10:
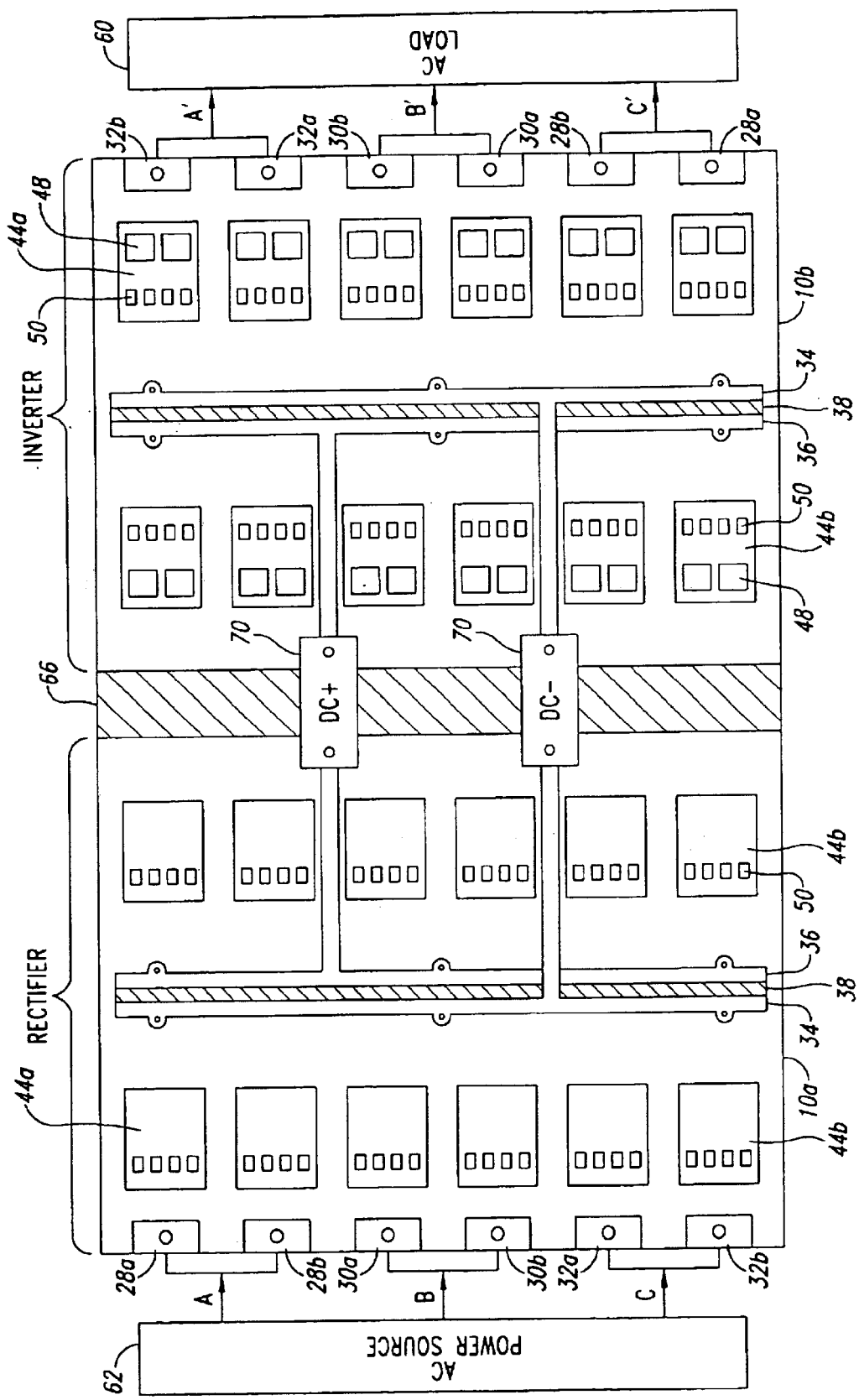
FIG. 10 is a topological view of the pair of power modules in back-to-back configuration of FIG. 9 configured as a high power inverter between a power source and a load, illustrating some aspects of the architecture of the power module and the topology of the substrate.

FIG. 10 shows a pair of power modules 10a, 10b physically coupled back-to-back similar to that of FIG. 9, and electrically coupled to create a first embodiment of a power converter. The first power module 10a is operated as a starter inverter while a second power module 10b functions as a main inverter. Note that the IGBTs 48 have been removed from the regions 44 of the first power module 10a, since the IGBTs are not necessary for the rectification, thus significantly reducing the cost of the inverter. A dielectric 66 is interposed between the cold plates of the first and the second power module.

This modular approach takes advantage of the unique topology of the standard power module 10 to provide a simple, cost effective, form factor solution to customer demands for various levels of power.

Dual Power Module Dual 3 Phase Inverter

Figure 11:
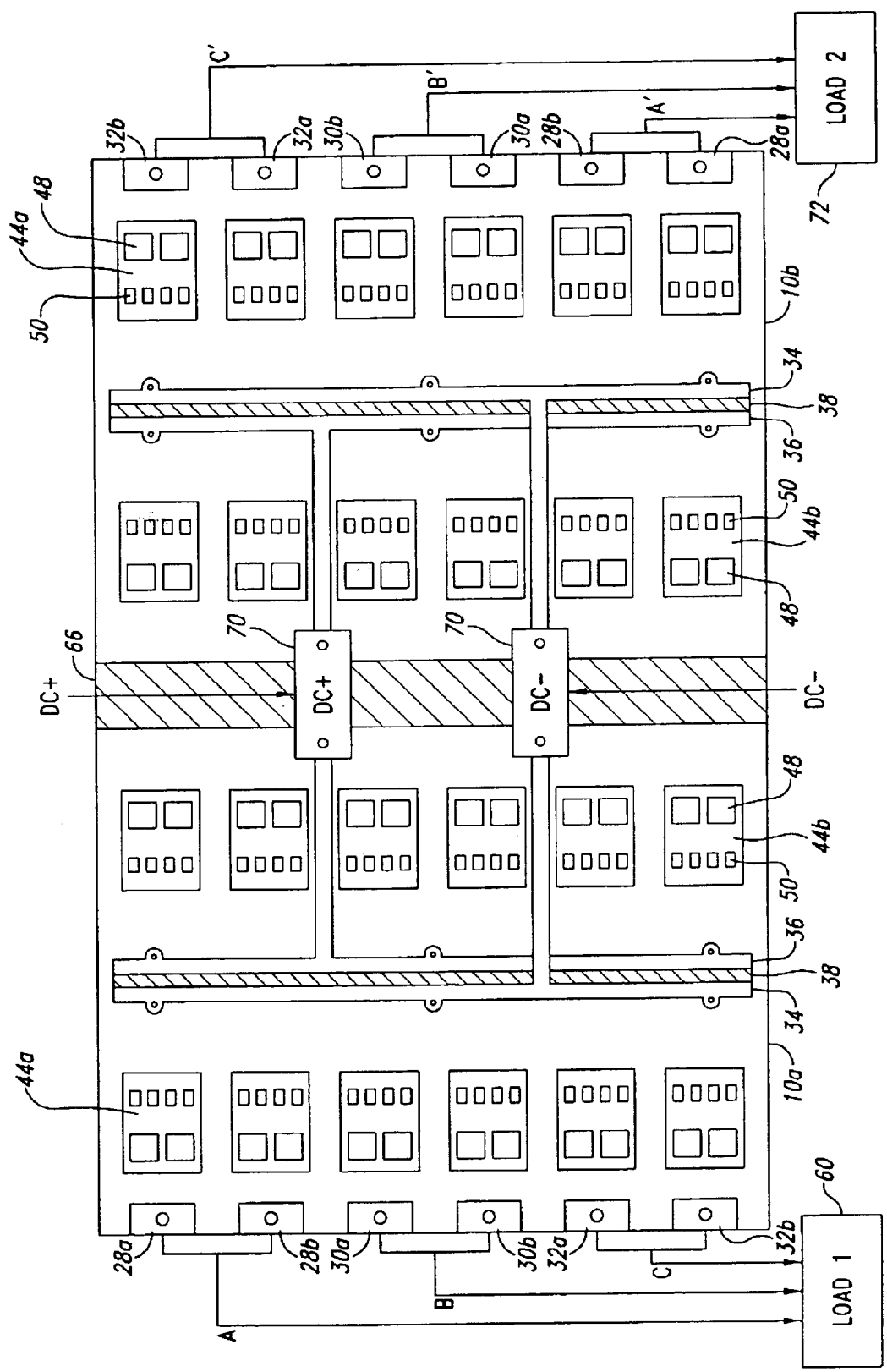
FIG. 11 is a topological view of pair of power modules in back-to-back configuration of FIG. 9 configured as two three phase inverters providing power to a pair of loads, illustrating some aspects of the architecture of the power module and the topology of the substrate.

FIG. 11 shows a pair of power modules 10a, 10b physically coupled back-to-back similar to that of FIG. 9, and electrically coupled as two three phase inverters. The inverter may be suitable for providing power to two three phase AC loads. The inverter may be suitable, for example, for providing 600 A at 1200V or 800 A at 600V for each load.

The external connector 70 (illustrated as separate DC+ and DC− connectors for clarity), electrically couples the DC bus bars 34, 36 of the first power module 10a to respective ones of the DC bus bars 34, 36 of the second module 10b. The external connector 70 further couples the DC bus bars 34, 36 to a DC power source DC+, DC−.

Pairs of the AC phase terminals 28a, 28b, 30a, 30b, 32a, 32b of the first power module 10a are electrically coupled to provide respective phases (A, B, or C) to a first three phase AC load 60. Pairs of the AC phase terminals 28a, 28b, 30a, 30b, 32a, 32b of the second power module 10b are electrically coupled to provide respective phases (A', B', or C') to a second three phase AC load 72.

Dual Power Module Single 3 Phase Inverter

Figure 12:
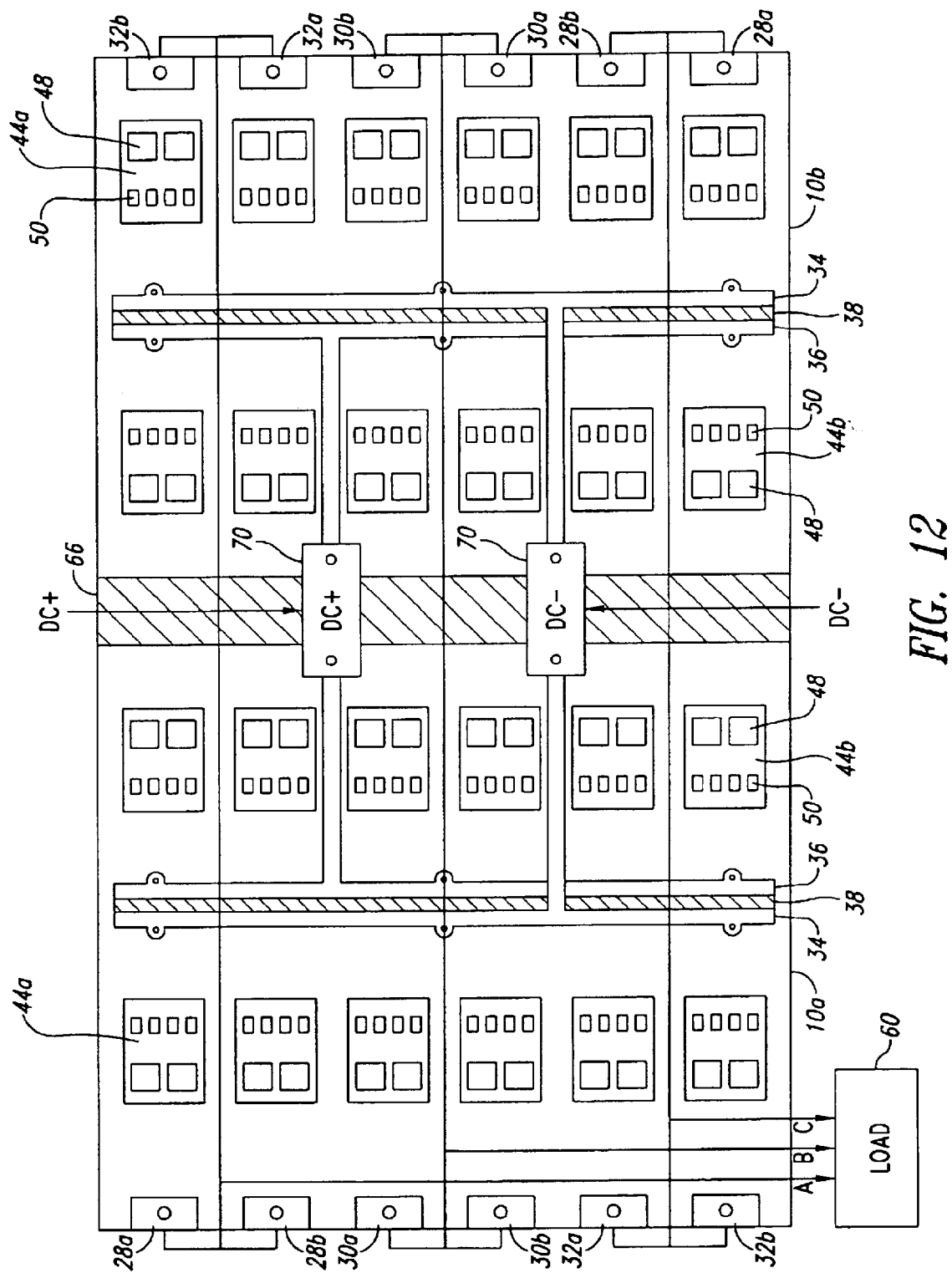
FIG. 12 is a topological view of the pair of power modules in back-to-back configuration of FIG. 9 configured as a single three phase power inverter between a power source and a load, illustrating some aspects of the architecture of the power module and the topology of the substrate.

FIG. 12 shows a pair of power modules 10a, 10b physically coupled back-to-back similar to that of FIG. 9, and electrically coupled as a single three phase inverter. The inverter may be suitable for providing power to a single three phase AC loads. The inverter may be suitable, for example, for providing 1200 A at 1200V or 1600 A at 600V.

The external connector 70 (illustrated as separate DC+ and DC− connectors for clarity), electrically couples the DC bus bars 34, 36 of the first power module 10a to respective ones of the DC bus bars 34, 36 of the second module 10b. The external connector 70 further couples the DC bus bars 34, 36 to a DC power source DC+, DC−.

A first pair of the AC phase terminals 28a, 28b of the first power module 10a is electrically coupled to a first pair 32a, 32b of the AC phase terminals of the second power module 10b, and to provide a first phase (A) to a three phase AC load 60. A second pair of the AC phase terminals 30a, 30b of the second power module 10b is electrically coupled to a second pair of AC phase terminals 30a, 30b of the second power module 10b and to provide a second phase (B) to the three phase AC load 60. A third pair of the AC phase terminals 32a, 32b of the first power module 10a is electrically coupled to a third pair of the AC phase terminals 28a, 28b of the second power module 10b and to provide a third phase (C) to the three phase AC load 60.

High Power Inverter

Figure 13:
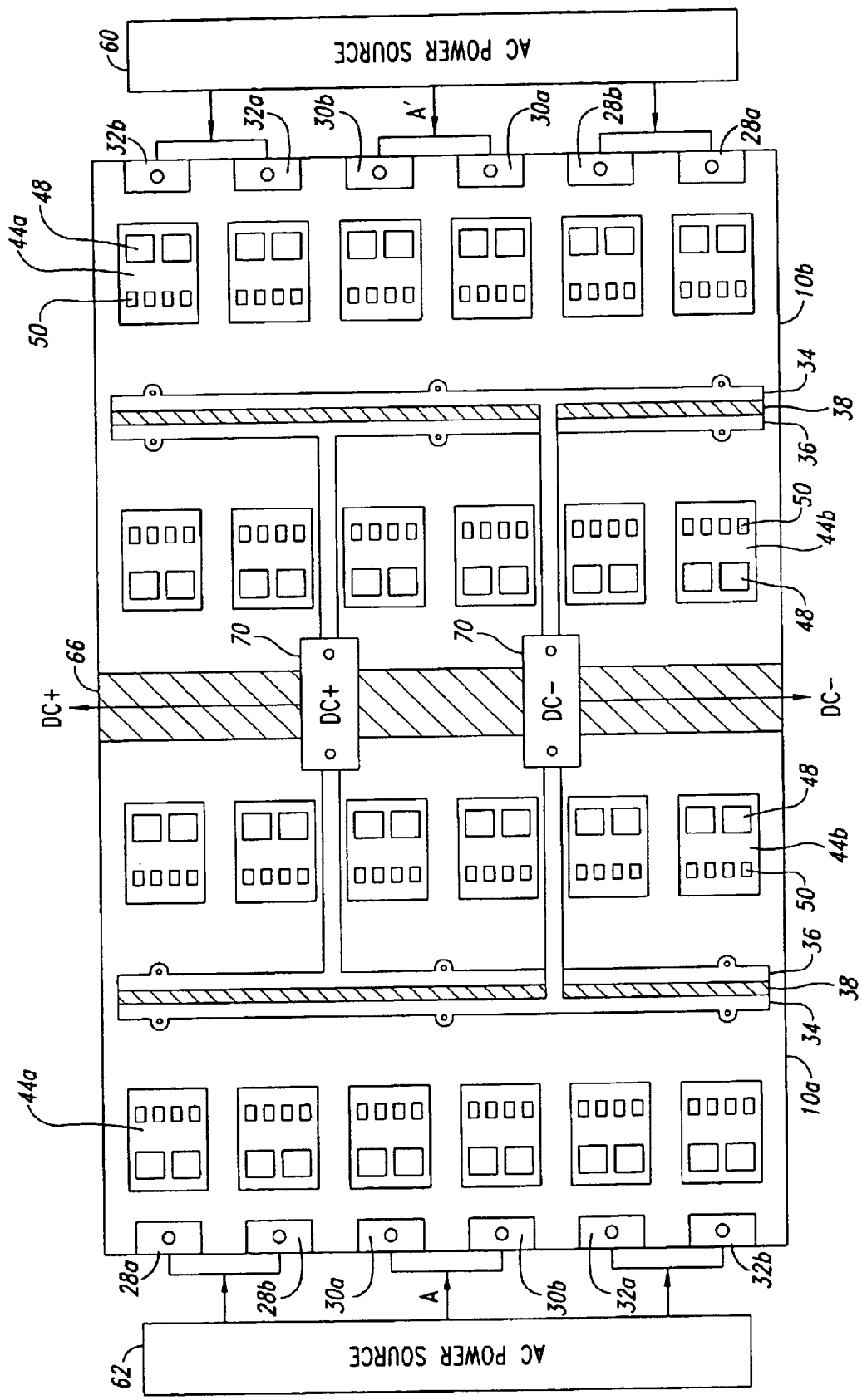
FIG. 13 is a topological view of the pair of power modules in back-to-back configuration of FIG. 9 configured as a half bridge rectifier between a power source and a load, illustrating some aspects of the architecture of the power module and the topology of the substrate.

FIG. 13 shows a pair of power modules 10a, 10b physically coupled back-to-back similar to that of FIG. 9, and electrically coupled to create a high power inverter (e.g., twice the power of an inverter based on a single power module).

The external connector 70 (illustrated as separate DC+ and DC− connectors for clarity), electrically couples the DC bus bars 34, 36 of the first power module 10a to respective ones of the DC bus bars 34, 36 of the second module 10b.

The phase terminals of the first power module 10*a* are electrically coupled in pairs to respective phases of a three phase AC power source 62. The phase terminals of the main inverter are electrically coupled in pairs to a three phase AC load 60.

The first power module 10*a* is operated as a rectifier while a second power module 10*b* functions as a main inverter. Note that the IGBTs 48 have been removed from the regions 44 of the first power module 10*a*, since the IGBTs are not necessary for the rectification, thus significantly reducing the cost of the inverter.

Dual Power Module H-Bridge Rectifier

Figure 14:
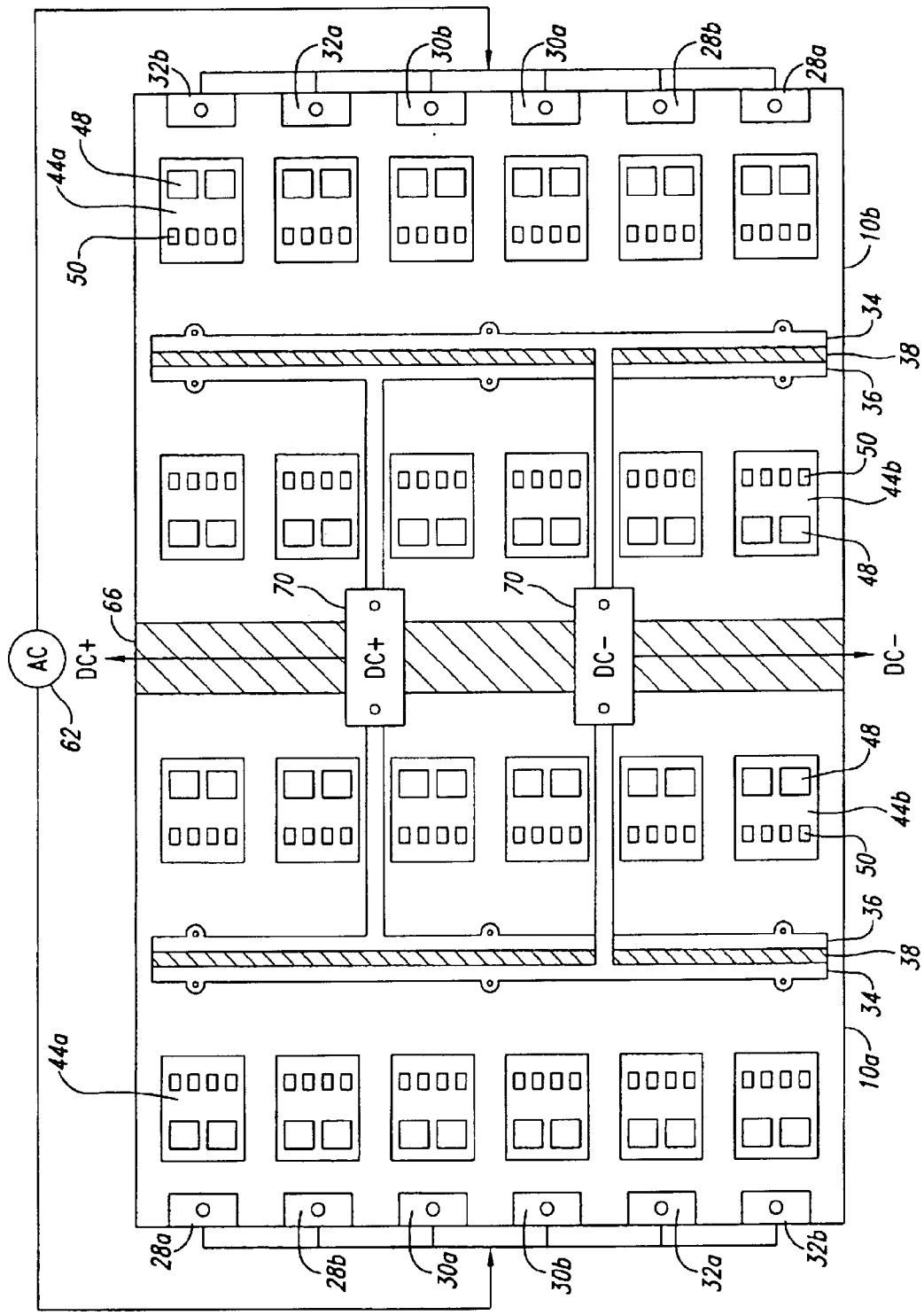
FIG. 14 is a topological view of the pair of power modules in back-to-back configuration of FIG. 9 configured as an H-bridge rectifier between a power source and a load, illustrating some aspects of the architecture of the power module and the topology of the substrate.

FIG. 14 shows a pair of power modules 10*a*, 10*b* physically coupled back-to-back similar to that of FIG. 9, and electrically coupled as a half bridge. The half bridge may be suitable, for example, for providing 1800 A at 1200V, or 2400 A at 600V. In typical use, a separate half bridge will be provided for each phase.

The external connector 70 (illustrated as separate DC+ and DC− connectors for clarity), electrically couples the DC bus bars 34, 36 of the first power module 10*a* to respective ones of the DC bus bars 34, 36 of the second module 10*b*. The external connector 70 further couples the DC bus bars 34, 36 to a DC power source DC+, DC−.

All of the AC phase terminals 28*a*, 28*b*, 30*a*, 30*b*, 32*a*, 32*b* of the first power module 10*a* are electrically coupled to one line of an AC power source 62. All of the AC phase terminals 28*a*, 28*b*, 30*a*, 30*b*, 32*a*, 32*b* of the second power module 10*b* are electrically coupled to the other line of an AC source 62.

Although specific embodiments of and examples for the power module and method of the invention are described herein for illustrative purposes, various equivalent modifications can be made without departing from the spirit and scope of the invention, as will be recognized by those skilled in the relevant art. The teachings provided herein of the invention can be applied to power module and power converters, rectifiers and/or inverters not necessarily the exemplary power module and systems generally described above.

While elements may be describe herein and in the claims as "positive" or "negative" such denomination is relative and not absolute. Thus, an element described as "positive" is shaped, positioned and/or electrically coupled to be at a higher relative potential than elements described as "negative" when the power module 10 is coupled to a power source. "Positive" elements are typically intended to be coupled to a positive terminal of a power source, while "negative" elements are intended to be coupled to a negative terminal or ground of the power source. Generally, "positive" elements are located or coupled to the high side of the power module 10 and "negative" elements are located or coupled to the low side of the power module 10.

The power modules described above may employ various methods and regimes for operating the power modules 10 and for operating the switches (e.g., IGBTs 48). The particular method or regime may be based on the particular application and/or configuration. Basic methods and regimes will be apparent to one skilled in the art, and do not form the basis of the inventions described herein so will not be discussed in detail for the sake of brevity and clarity.

The various embodiments described above can be combined to provide further embodiments. All of the above U.S. patents, patent applications and publications referred to in this specification, including but not limited to: Ser. Nos. 60/233,992; 60/233,993; 60/233,994; 60/233,995 and 60/233,996 each filed Sep. 20, 2000; Ser. No. 09/710,145 filed Nov. 10, 2000; Ser. Nos. 09/882,708 and 09/957,047 both filed Jun. 15, 2001; Ser. Nos. 09/957,568 and 09/957,001 both filed Sep. 20, 2001; Ser. No. 10/109,555 filed Mar. 27, 2002; and Ser. No. 60/471,387 filed May 16, 2003, are incorporated herein by reference, in their entirety, as are the sections which follow this description. Aspects of the invention can be modified, if necessary, to employ systems, circuits and concepts of the various patents, applications and publications to provide yet further embodiments of the invention.

These and other changes can be made to the invention in light of the above-detailed description. In general, in the following claims, the terms used should not be construed to limit the invention to the specific embodiments disclosed in the specification and the claims, but should be construed to include all power modules, rectifiers, inverters and/or converters that operate or embody the limitations of the claims. Accordingly, the invention is not limited by the disclosure, but instead its scope is to be determined entirely by the following claims.

What is claimed is:

1. A power system, comprising:

a first power module comprising a module housing, a cold plate attached to the module housing, a first bus accessible from an exterior of the module housing, a second bus accessible from the exterior of the module housing, the second bus electrically isolated from the first bus, a first set of electrical terminals accessible from the exterior of the module housing, for each of the electrical terminals in the first set of electrical terminals, a number of first leg components electrically coupled between the electrical terminal and the first bus, and a number of second leg components electrically coupled between the electrical terminal and the second bus;

a second power module comprising a module housing, a cold plate attached to the module housing, a first bus accessible from an exterior of the module housing, a second bus accessible from the exterior of the module housing, the second bus electrically isolated from the first bus, a first set of electrical terminals accessible from the exterior of the module housing, for each of the electrical terminals in the first set of electrical terminals, a number of first leg components electrically coupled between the electrical terminal and the first bus, and a number of second leg components electrically coupled between the electrical terminal and the second bus; and at least one external connector electrically coupling the first and the second buses of the first power module with respective ones of the first and the second buses of the second power module.

2. The power system of claim 1 wherein the first and the second power modules are arranged back-to-back with the cold plate of the first power module facing the cold plate of the second power module.

3. The power system of claim 2, further comprising:

a dielectric interposed between the cold plates of the first and the second power modules.

4. The power system of claim 1 wherein the first and the second buses of the first power module comprise a first bus bar and a second bus bar substantially parallel to and spaced from the first bus bar by a first dielectric, each of the first and the second bus bars comprising at least two terminals extending out of the module housing of the first power module to provide access to the first and the second buses externally from the module housing, and wherein the first and the second buses of the second power module comprise a first bus bar and a second bus bar substantially parallel to and spaced from the first bus bar by a second dielectric, each of the first and the second bus bars comprising at least two terminals extending out of the module housing of the second power module to provide access to the first and the second buses externally from the module housing.

5. The power system of claim 1 wherein the external connector is approximately U-shaped.

6. The power system of claim 1 wherein the external connector is formed as a laminate comprising a first conducting layer, a second conducting layer and at least one electrically insulating layer electrically isolating the first conducting layer from the second conducting layer.

7. The power system of claim 1 wherein the first and the second leg components comprise at least one of an integrated gate bipolar transistor, a metal oxide semiconductor field effect transistor, and a diode.

8. The power system of claim 1 wherein the first power module is operable to passively rectify an alternating current received at the first set of electrical terminals of the first power module and the second power module is operable to invert a direct current received at the first and the second buses of the second power module.

9. The power system of claim 1 wherein the first power module is operable to actively rectify an alternating current received at the first set of electrical terminals of the first power module and the second power module is operable to invert a direct current received at the first and the second buses of the second power module.

10. The power system of claim 1 wherein the first power module is operable to rectify an alternating current received at the first set of electrical terminals of the first power module to provide a direct current on the first and the second buses of the first power module, and wherein the second power module is operable to rectify an alternating current received at the first set of electrical terminals of the second power module to provide a direct current at the first and the second buses of the second power module.

11. The power system of claim 10 wherein the first set of electrical terminals of the first power module comprises six electrical terminals where a first three of the electrical terminals are electrically connected together and a second three of the electrical terminals are electrically connected together, and wherein the first set of electrical terminals of the second power module comprises six electrical terminals where a first three of the electrical terminals are electrically connected together and a second three of the electrical terminals are electrically connected together.

12. The power system of claim 10 wherein the first power module comprises six electrical terminals in the first set of electrical terminals where the six electrical terminals are electrically connected together, and wherein the second power module comprises six electrical terminals in the first set of electrical terminals where the six electrical terminals are electrically connected together.

13. The power system of claim 1 wherein the first power module is operable to invert a direct current received at the first and the second buses of the first power module to provide an alternating current at the first set of terminals of the first power module, and wherein the second power module is operable to invert a direct current received at the first and the second buses of the second power module to provide an alternating current at the first set of terminals of the second power module.

14. The power system of claim 13 wherein each of the electrical terminals of the first power module is electrically connected to a respective phase of a first load, and each of the electrical terminals of the second power module is electrically connected to a respective phase of a second load.

15. The power system of claim 13 wherein each of the electrical terminals of the first power module is electrically connected to a respective one of the electrical terminals of the second power module.

16. A power system, comprising:
a rectifier power module comprising a module housing, a cold plate attached to the module housing, a set of input terminals, a first output bus and a second output bus;
an inverter power module comprising a module housing, a cold plate attached to the module housing, a first input bus, a second input bus, and a set of output terminals, wherein the cold pate of the inverter power module faces the cold plate of the rectifier power module; and
at least one external connector electrically coupling each of the first and the second output buses of the rectifier power module with a respective one of the first and the second input buses of the inverter power module.

17. The power system of claim 16, further comprising:
a dielectric interposed between the cold plates of the rectifier power module and the inverter power module.

18. The power system of claim 17 wherein the external connector is formed as an approximately U-shaped laminate comprising a first conducting layer, a second conducting layer and at least one electrically insulating layer electrically isolating the first conducting layer from the second conducting layer, the external connector comprising a first arm and a second arm spaced from the first arm sufficiently to receive the rectifier power module and the inverter power module therebetween.

19. The power system of claim 16 wherein the rectifier power module comprises a number of transistors electrically coupled to actively rectify an alternating current received at the set of input terminals.

20. A power system, comprising:
a first rectifier power module comprising a module housing, a cold plate attached to the module housing, a set of input terminals, a first output bus and a second output bus;
a second rectifier power module comprising a module housing, a cold plate attached to the module housing, a set of input terminals, a first output bus and a second output bus, wherein the cold pate of the second rectifier power module faces the cold plate of the first rectifier power module; and
at least one external connector electrically coupling each of the first and the second output buses of the first rectifier power module with a respective one of the first and the second output buses of the second rectifier power module.

21. The power system of claim 20, further comprising:
a dielectric interposed between the cold plates of the first and the second power modules.

22. The power system of claim 21 wherein the external connector is formed as an approximately U-shaped laminate comprising a first conducting layer, a second conducting layer and at least one electrically insulating layer electrically isolating the first conducting layer from the second conducting layer.

23. The power system of claim 22 wherein the first and the second rectifier power modules are configured as an H-bridge.

24. The power system of claim 22 wherein the first and the second rectifier power modules are configured as a half bridge.

25. The power system of claim 22 wherein the at least one of the first and the second rectifier power modules comprises a number of transistors electrically coupled to actively rectify an alternating current received at the respective set of input terminals.

26. A power system, comprising:
a first inverter power module comprising a module housing, a cold plate attached to the module housing, a first input bus and a second input bus, and a set of output terminals;
a second inverter power module comprising a module housing, a cold plate attached to the module housing, a first input bus and a second input bus, and a set of output terminals, wherein the cold pate of the second inverter power module faces the cold plate of the first inverter power module; and
at least one external connector electrically coupling each of the first and the second input buses of the first inverter power module with a respective one of the first and the second input buses of the second inverter power module.

27. The power system of claim 26, further comprising:
a dielectric interposed between the cold plates of the first and the second inverter power modules.

28. The power system of claim 27 wherein the external connector is formed as an approximately U-shaped laminate conforming to at least a portion of an exterior of the first and the second inverter power modules, the U-shape laminate comprising a first conducting layer, a second conducting layer and at least one electrically insulating layer electrically isolating the first conducting layer from the second conducting layer.

29. The power system of claim 28 wherein at least a first, a second and a third one of the output terminals of the first inverter power module is electrically coupled to supply a respective phase of three phase AC power to a first load and at least a first, a second and a third one of the output terminals of the second inverter power module is electrically coupled to supply a respective phase of three phase AC power to a second load.

30. The power system of claim 28 wherein at least a first one of the output terminals of each of the first and the second inverter modules are electrically coupled to supply a first phase of three phase AC power to a first load, at least a second one of the output terminals of each of the first and the second inverter modules are electrically coupled to supply a second phase of three phase AC power to the first load, and at least a third one of the output terminals of each of the first and the second inverter modules are electrically coupled to supply a third phase of three phase AC power to the first load.

31. A method of forming a power system, comprising:
providing a first power module comprising a module housing, a cold plate attached to the module housing, a first bus accessible from an exterior of the module housing, a second bus accessible from the exterior of the module housing, the second bus electrically isolated from the first bus, a first set of electrical terminals accessible from the exterior of the module housing, for each of the electrical terminals in the first set of electrical terminals, a number of first leg components electrically coupled between the electrical terminal and the first bus, and a number of second leg components electrically coupled between the electrical terminal and the second bus;
providing a second power module comprising a module housing, a cold plate attached to the module housing, a first bus accessible from an exterior of the module housing, a second bus accessible from the exterior of the module housing, the second bus electrically isolated from the first bus, a first set of electrical terminals accessible from the exterior of the module housing, for each of the electrical terminals in the first set of electrical terminals, a number of first leg components electrically coupled between the electrical terminal and the first bus, and a number of second leg components electrically coupled between the electrical terminal and the second bus; and
externally electrically coupling the first and the second buses of the first power module with respective ones of the first and the second buses of the second power module.

32. The method of claim 31 wherein externally electrically coupling the first and the second buses of the first power module with respective ones of the first and the second buses of the second power module comprises attaching an external connector between the first buses of the first and the second power modules and attaching the external connector between the second buses of the first and the second power modules.

33. The method of claim 31 wherein externally electrically coupling the first and the second buses of the first power module with respective ones of the first and the second buses of the second power module comprises attaching an approximately U shaped external laminate connector conforming to an exterior of the first and the second power modules between the first buses of the first and the second power modules and attaching the U shaped external laminate connector between the second buses of the first and the second power modules.

* * * * *